(12) United States Patent
Choi et al.

(10) Patent No.: US 9,966,419 B2
(45) Date of Patent: May 8, 2018

(54) DISPLAY DEVICE AND MANUFACTURING METHOD OF THE SAME

(71) Applicant: Samsung Display Co., Ltd., Yongin-si, Gyeonggi-do (KR)

(72) Inventors: Su Hyuk Choi, Yongin-si (KR); Jin Woo Park, Yongin-si (KR); Ho Youn Kim, Yongin-si (KR); Hyun Chul Oh, Yongin-si (KR); Ung Soo Lee, Yongin-si (KR); Jun Young Lee, Yongin-si (KR); Hyun Soo Jung, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days. days.

(21) Appl. No.: 15/219,144

(22) Filed: Jul. 25, 2016

(65) Prior Publication Data

US 2017/0170242 A1 Jun. 15, 2017

(30) Foreign Application Priority Data

Dec. 11, 2015 (KR) ........................ 10-2015-0176679

(51) Int. Cl.
*H01L 29/207* (2006.01)
*H01L 27/32* (2006.01)
(Continued)

(52) U.S. Cl.
CPC ........ *H01L 27/323* (2013.01); *H01L 51/0097* (2013.01); *H01L 51/5203* (2013.01);
(Continued)

(58) Field of Classification Search
CPC ............ H01L 51/0097; H01L 51/5203; H01L 51/5243; H01L 51/5256; H01L 51/56; H01L 27/323; H01L 27/3232; H01L 27/3223; H01L 27/322; H01L 27/3225; H01L 27/32; H01L 51/5246
See application file for complete search history.

(56) References Cited

U.S. PATENT DOCUMENTS 8,139,041 B2 3/2012 Na
8,872,168 B2 10/2014 Choi et al.
(Continued)

FOREIGN PATENT DOCUMENTS

KR 10-0976527 B1 8/2010
KR 10-1009672 B1 1/2011
(Continued)

*Primary Examiner* — Yosef Gebreyesus
(74) *Attorney, Agent, or Firm* — Innovation Counsel, LLP

(57) ABSTRACT

A display device includes a first substrate including a first area and a second area, light emitting elements arranged in the first area, connecting pads arranged in the second area, a thin film encapsulation layer arranged on the light emitting elements, a second substrate including a third area and a fourth area, sensing pads arranged in the fourth area, a touch sensor layer including sensing electrodes arranged in the third area and sensing lines connected between the sensing electrodes and the sensing pads, an interlayer arranged between the thin film encapsulation layer and the touch sensor layer, and a conductive member connected between the connecting pads and the sensing pads.

21 Claims, 12 Drawing Sheets

(51) Int. Cl.
    *H01L 51/56*     (2006.01)
    *H01L 51/52*     (2006.01)
    *H01L 51/00*     (2006.01)

(52) U.S. Cl.
    CPC ...... *H01L 51/5246* (2013.01); *H01L 51/5256* (2013.01); *H01L 51/56* (2013.01)

(56) References Cited

U.S. PATENT DOCUMENTS

| | | |
|---|---|---|
| 9,007,329 B2 | 4/2015 | Lee et al. |
| 2011/0316802 A1* | 12/2011 | Choi ................. G06F 3/041 345/173 |
| 2013/0021289 A1* | 1/2013 | Chen ................. G06F 1/1601 345/174 |
| 2013/0106813 A1* | 5/2013 | Hotelling .......... G06F 1/1626 345/207 |
| 2013/0127770 A1* | 5/2013 | Trend ................ G06F 3/044 345/174 |
| 2014/0092630 A1* | 4/2014 | Franklin ........... G02B 6/0031 362/609 |
| 2015/0060817 A1 | 3/2015 | Sato et al. |

FOREIGN PATENT DOCUMENTS

| | | |
|---|---|---|
| KR | 10-2015-0026921 A | 3/2015 |
| KR | 10-2015-0031807 A | 3/2015 |
| KR | 10-1544065 B1 | 8/2015 |

\* cited by examiner

DISPLAY DEVICE AND MANUFACTURING METHOD OF THE SAME

RELATED APPLICATIONS

The present application claims priority under 35 U.S.C. 119(a) to Korean Patent Application No. 10-2015-0176679, filed on Dec. 11, 2015, in the Korean Intellectual Property Office, the entire contents of which are incorporated herein by reference in their entirety.

BACKGROUND

1. Field

An aspect of the present disclosure relates to a display device and manufacturing method of the same.

2. Description of the Related Art

Recently, a display device embodies a touch recognition function to receive an input of a user's touch and an image display function.

A range of use of the display device has been expanded since it does not require a separate input device, for example, a keyboard and a mouse.

In the prior art, the display device is manufactured by a method of bonding a touch panel to a display panel after manufacturing the display panel and the touch panel, respectively.

However, the above method requires a manufacturing process of the touch panel in addition to that of the display panel. Thus, the above method is considered to be inefficient in terms of manufacturing time and expense. Accordingly, there exists a need for the presently disclosed device and manufacturing method thereof.

SUMMARY

According to an aspect of the present disclosure, there is provided a display device including a touch panel and a manufacturing method thereof.

According to another aspect of the present disclosure, there is provided a display device including a touch panel with a simplified manufacturing process and a manufacturing method thereof.

According to an embodiment, the display device may include a first substrate including a first area and a second area, light emitting elements arranged in the first area, connecting pads arranged in the second area, a thin film encapsulation layer arranged on the light emitting elements, sensing pads arranged in a third area and a fourth area, sensing electrodes arranged in the third area and a touch sensor layer including sensing lines connected between the sensing electrodes and the sensing pads, an interlayer arranged between the thin film encapsulation layer and the touch sensor layer and a conductive member connected between the connecting pads and the sensing pads.

The sensing electrodes may include sensing cells, connecting patterns which interconnect the sensing cells, and auxiliary cells that are arranged on a layer different from the sensing cells and electrically connected with the sensing cells.

The sensing lines may be arranged on a different layer from first conductive lines and the first conductive lines, and include second conductive lines electrically connected with the first conductive lines.

The touch sensor layer may further comprise an insulating layer, and the insulating layer may be arranged between the sensing cells and the auxiliary cells, and between the first conductive layers and the second conductive layers.

The sensing pads may include first conductive patterns and second conductive patterns contacting with the first conductive patterns.

The first conductive lines may be directly connected to the first conductive patterns.

The second conductive lines may be directly connected to the second conductive patterns.

The second conductive lines may be spaced apart from the second conductive patterns by a predetermined distance and electrically connected to the first conductive patterns through the first conductive lines.

A distance between the second conductive lines and the second conductive patterns may be set to 10 um to 1000 um.

The sensing cell and the auxiliary cells may comprise a mesh shape including a plurality of openings.

The connecting patterns may comprise the mesh shape including the plurality of openings.

The thin film encapsulation layer may include at least one organic layer and at least one inorganic layer.

The interlayer may have adhesiveness.

The interlayer may overlap the sensing electrodes and the sensing lines.

A thickness of the interlayer may be set to 5 um to 30 um.

The first substrate and the second substrate may be flexible.

The third substrate bonded to the first substrate and the fourth substrate bonded to the second substrate may be included.

The third substrate and the fourth substrate may be rigid.

The third area may overlap the first area.

A polarizing film arranged in an upper portion or a lower portion may be further included.

The conductive member may include a conductive ball.

According to another aspect of the present disclosure, there is provided a manufacturing method of the display device may include preparing a first substrate forming light emitting elements, a thin film encapsulation layer and connecting pads to first substrate, preparing a second substrate forming a touch sensor layer including the sensing electrodes and the sensing lines and sensing pads electrically connected to the sensing electrodes through the sensing lines to the second substrate, applying an interlayer to the thin film encapsulation layer or the touch sensor layer, applying a conductive member on the connecting pads and sensing pads, reversing the second substrate such that the touch sensor layer may face with the thin film encapsulation layer, and bonding the first substrate to the second substrate through the interlayer.

The applying the interlayer may use one of a printing method, a coating method and a dispensing method.

The first substrate and the second substrate may be a flexible substrate. When preparing the first substrate, a rigid third substrate may be used for a carrier substrate of the first substrate, and when preparing the second substrate, a rigid fourth substrate may be used for a carrier substrate of a second carrier substrate.

The manufacturing method may further include removing the third and fourth substrates.

The interlayer may have the adhesiveness.

The bonding of the first substrate to the second substrate may comprise electrically connecting the connecting pads to the sensing pads through the conductive member.

The sensing electrodes may include sensing cells, connecting patterns interconnecting the sensing cells and auxiliary cells arranged on a layer different from that of the sensing cells and electrically connected to the sensing cells.

The sensing lines may include first conductive lines and second conductive lines arranged on a layer different from that of the first conductive lines and electrically connected to the first conductive lines.

The preparing of the second substrate may comprise further forming an insulating layer arranged between the sensing cells and the auxiliary cells and between the first conductive lines and the second conductive lines.

The sensing pads may include first conductive patterns and second conductive patterns contacting the first conductive patterns.

The first conductive lines may be directly connected to the first conductive patterns The second conductive lines may be directly connected to the second conductive patterns.

The second conductive lines may be spaced apart from the second conductive patterns by a predetermined distance and electrically connected to the first conductive patterns through the first conductive lines.

The distance between the second conductive lines and the second conductive patterns may be set to 10 um to 1000 um.

The sensing cells and the auxiliary cells may include a mesh shape including a plurality of openings.

The connecting patterns may include the mesh shape including the plurality of openings.

The thin film encapsulation layer may include at least one organic layer and at least one inorganic layer.

The conductive member may include a conductive ball.

The applying of the conductive member may comprise using a dispensing method.

DETAILED DESCRIPTION

Figure 1:
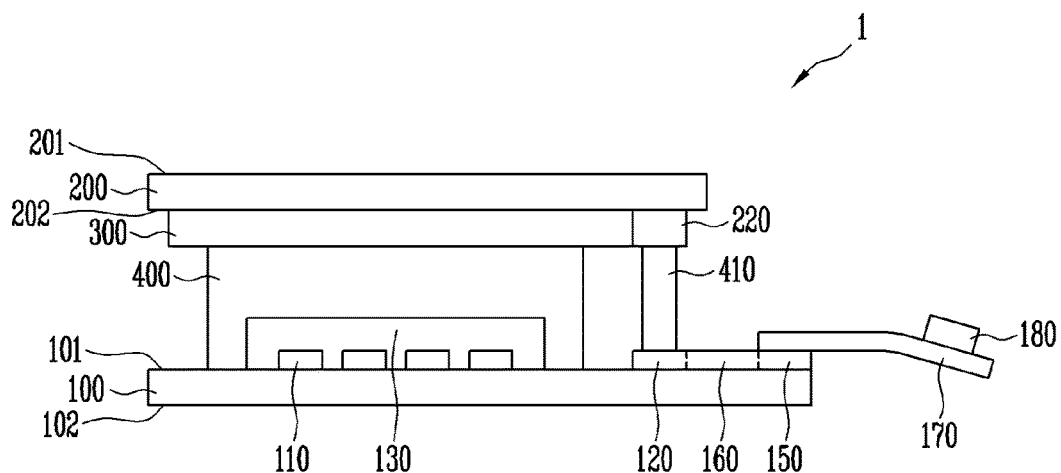
FIG. 1 is a schematic cross-sectional view illustrating a display device according to an embodiment of the present disclosure.

Embodiments of the present disclosure are described in detail herein with reference to the accompanying figures.

Example embodiments are now described more fully hereinafter with reference to the accompanying drawings; however, they may be embodied in different forms and are not limited to the embodiments set forth herein. Rather, these embodiments are provided to help convey the scope of the example embodiments to those of ordinary skill in the art. In the drawing figures, dimensions may be exaggerated for clarity of illustration. When an element is referred to as being "connected" to another element, it may be directly connected to the other element, or one or more intervening elements may also be present. Like reference numerals refer to like elements throughout.

Hereinafter, exemplary embodiments of the present disclosure are described in detail with reference to the accompanying drawings.

FIG. 1 is a schematic view illustrating an ending portion of a display device according to an embodiment of the present disclosure.

Referring to FIG. 1, a display device 1 according to an embodiment of the present disclosure may include a first substrate 100, light emitting elements 110, connecting pads 120, a thin film encapsulation layer 130, driving pads 150, driving lines 160, a flexible printed circuit board (FPCB) 170, a touch driving circuit 180, a second substrate 200, sensing pads 220, touch sensor layer 300, an interlayer 400 and a conductive member 410.

The first substrate 100 and a second substrate 200 may be disposed opposite to each other.

The first substrate 100 may include a first side 101 facing the second substrate 200 and a second side 102 opposite to the first side 101.

In addition, the second substrate 200 may include a first side 201 and a second side 202 opposite to the first side 201 and facing the first substrate 100.

The first substrate 100 and the second substrate 200 may be formed of material with flexibility and, therefore, may be flexible and folded.

In addition, the first substrate 100 and the second substrate 200 may be formed of organic material, for example, polyimid-based, polyamid-based and acryl-based material.

The light emitting elements 110, the connecting pads 120, the thin film encapsulation layer 130, the driving pads 150 and the driving lines 160 may be formed of the first side 101 of the first substrate 100.

The light emitting elements 110 may be formed on the first substrate 100 and provide a predetermined image to a user by emitting a specific light, respectively.

The connecting pads 120 may be arranged on the first substrate 100 and electrically connected to the sensing pads 220 arranged on the second substrate 200 through the conductive member 410.

In addition, the connecting pads 120 may be electrically connected to the driving pads 150 through the driving lines 160.

The thin film encapsulation layer 130 may be formed on the light emitting elements 110 and protect the light emitting elements 110.

In other words, the thin film encapsulation layer 130 may protect the light emitting elements 110 from damage by sheltering the light emitting elements 110 from exposure to moisture and oxygen.

The driving pads 150 may be arranged at the outside of the connecting pads 120 and connected to the flexible printed circuit board 170.

The driving lines 160 may be connected between the connecting pads 120 and the driving pads 150.

The flexible printed circuit board 170 may be bonded to the driving pads 150, and a touch driving circuit 180, which controls the touch sensor layer 300 may be mounted on the flexible printed circuit board 170.

The sensing pads 220 and the touch sensor layer 300 may be formed on the second side 202 of the second substrate 200.

The touch sensor layer 300 may include configuration elements to recognize a touch of a user and be electrically connected to the sensing pads 220.

The interlayer 400 may protect the touch sensor layer 300 and bond the first substrate 100 to the second substrate 200.

Further, the interlayer 400 may have the adhesiveness to perform a bonding function and be formed of materials having insulation, transparency, and flexibility.

For example, a thickness of the interlayer 400 may be set to 5 um to 30 um.

Further, the interlayer 400 may be arranged between the thin film encapsulation layer 130 and the touch sensor layer 300.

For example, the interlayer 400 may be spread widely including the thin film encapsulation layer 130.

Accordingly, the interlayer 400 may be joined to the thin film encapsulation 130 and a partial area of the first substrate 100 adjacent to the thin film encapsulation 130.

A conductive member 410 may be connected between the connecting pads 120 arranged in the first substrate 100 and the sensing pads 220 arranged in the second substrate 200.

As a result, the touch sensor layer 300 may be electrically connected to the touch driving circuit 180 through the sensing pads 220, the conductive member 410, the connecting pads 120, the driving lines 160, the driving pads 150 and the flexible printed circuit board 170.

Accordingly, the touch driving circuit 180 may control an operation of the touch sensor layer 300.

Unlike an embodiment of the present disclosure, an alternative structure to separately retain an insulating layer to protect the touch sensor layer 300 and an adhesive for bonding the substrates 100 and 200 may be considered. However, such a structure would lead to an increase of the manufacturing time and expense in accordance with the complexity of the structure.

In other words, a display device 1 according to an embodiment of the present disclosure may replace the insulating layer and the adhesive with one interlayer 400. Under such an embodiment, the structure may become simplified and lead to a reduction of the manufacturing time and cost.

In addition, the interlayer 400 absorbs a particle that is generated while bonding the substrates 100 and 200, which may lead to an improvement of process yield.

Figure 2:
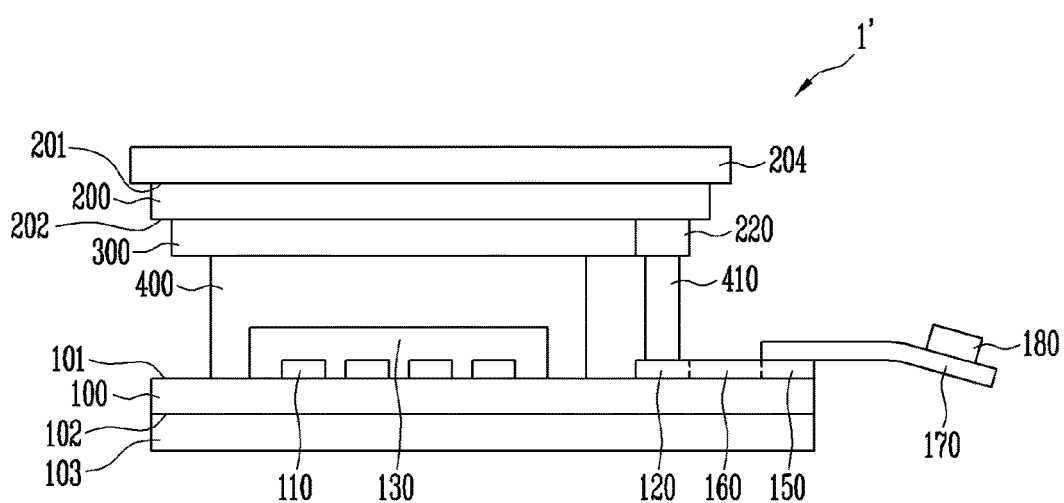
FIG. 2 is a schematic cross-sectional view illustrating a display device according to another embodiment of the present disclosure.

FIG. 2 is a schematic view illustrating an ending portion of a display device according to another embodiment of the present disclosure.

Referring to FIG. 2, the display device 1' according to another embodiment may further include a third substrate 103 and a fourth substrate 204.

The third substrate 103 may be bonded to the first substrate 100, and the fourth substrate 204 may be bonded to the second substrate 200.

In more detail, the third substrate 103 may be bonded to the second side 102 of the first substrate 100, and the fourth substrate 204 may be bonded to the first side 201 of the second substrate 200.

The third substrate 103 and the fourth substrate 204 may function as a carrier substrate to support the first substrate 100 and the second substrate 200, which may be flexible.

To this end, the third substrate 103 and the fourth substrate 204 may have rigid material. For example, the third substrate 103 and the fourth substrate 204 may be formed of glass.

Figure 3A:
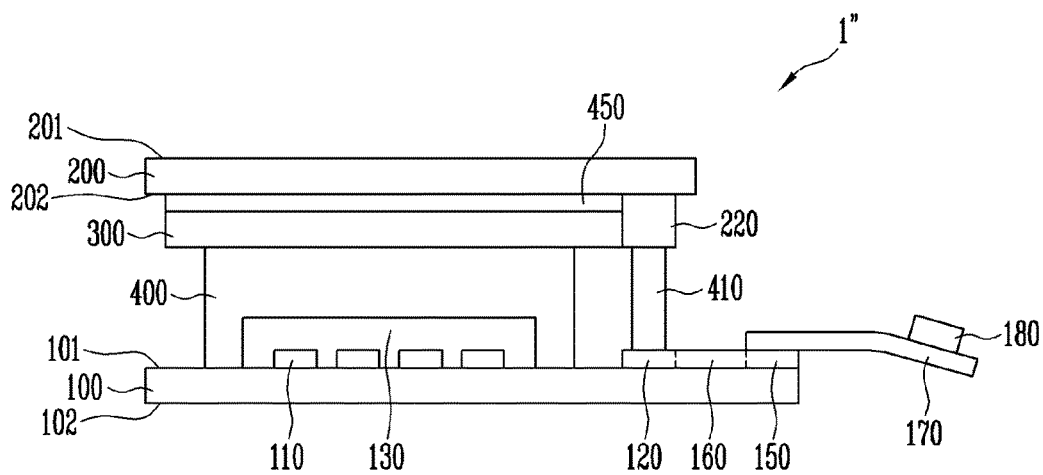
FIGS. 3A and 3B are schematic cross-sectional views illustrating a display device according to another embodiment of the present disclosure.
Figure 3B:
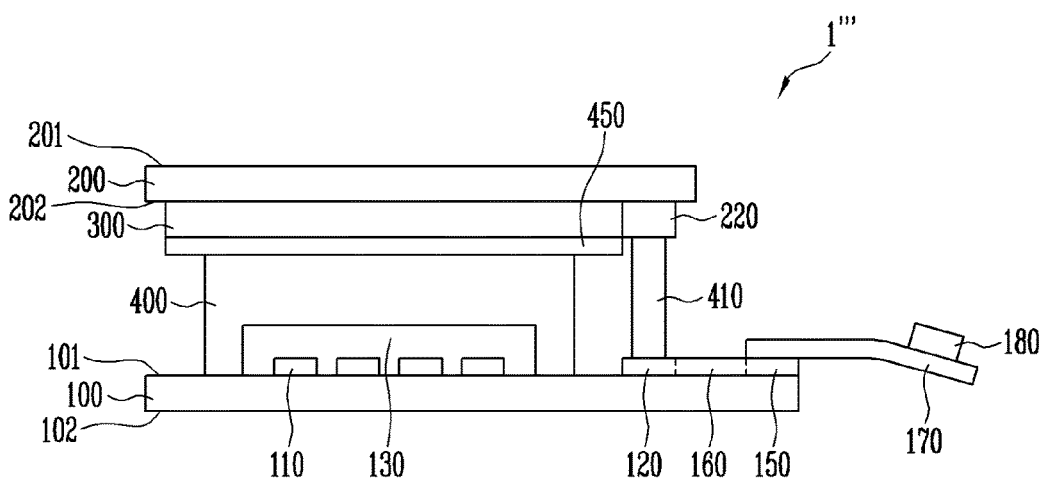

FIGS. 3A and 3B are schematic views illustrating an ending portion of a display device according to another embodiment of the present disclosure.

Referring to FIGS. 3A and 3B, the display devices 1'' and 1''' according to another embodiment of the present disclosure may further include the polarizing plate 450.

For example, as illustrated in FIG. 3A, the polarizing plate 450 may be arranged on the upper portion of the touch sensor layer 300.

Accordingly, the polarizing plate 450 may be arranged between the second substrate 200 and the touch sensor layer 300.

Further, as illustrate in FIG. 3B, the polarizing plate 450 may be arranged on a lower portion of the touch sensor layer 300.

Accordingly, the polarizing plate 450 may be arranged between the touch sensor layer 300 and the interlayer 400.

Figure 4:
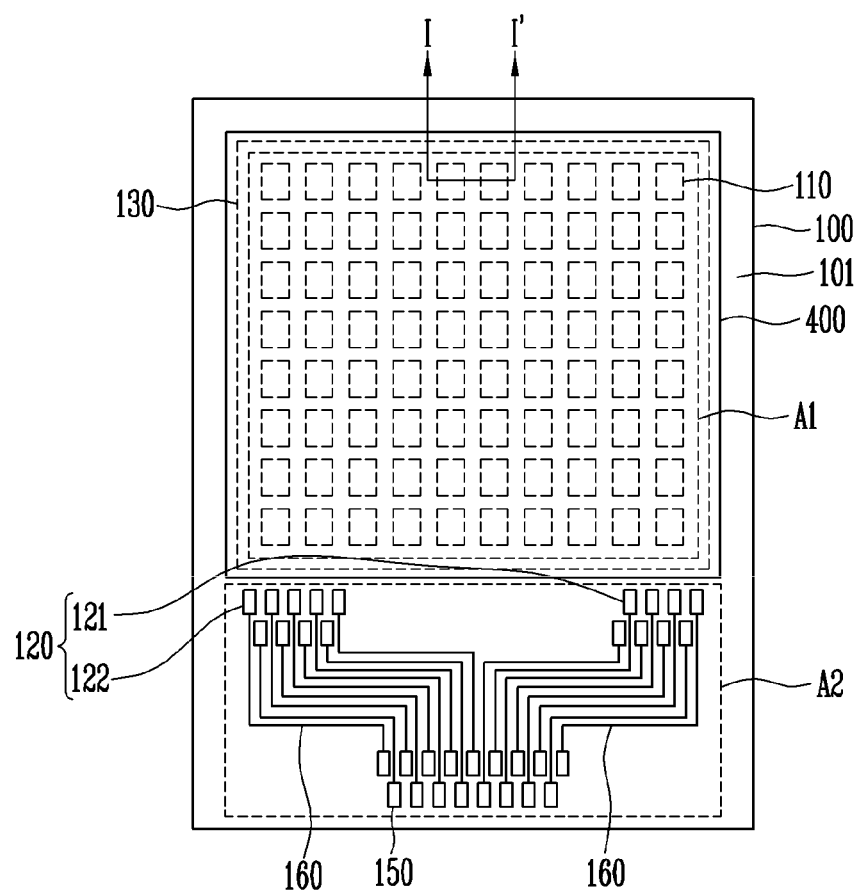
FIG. 4 is a schematic view illustrating a first substrate and configuration elements thereof according to an embodiment of the present disclosure.
Figure 5:
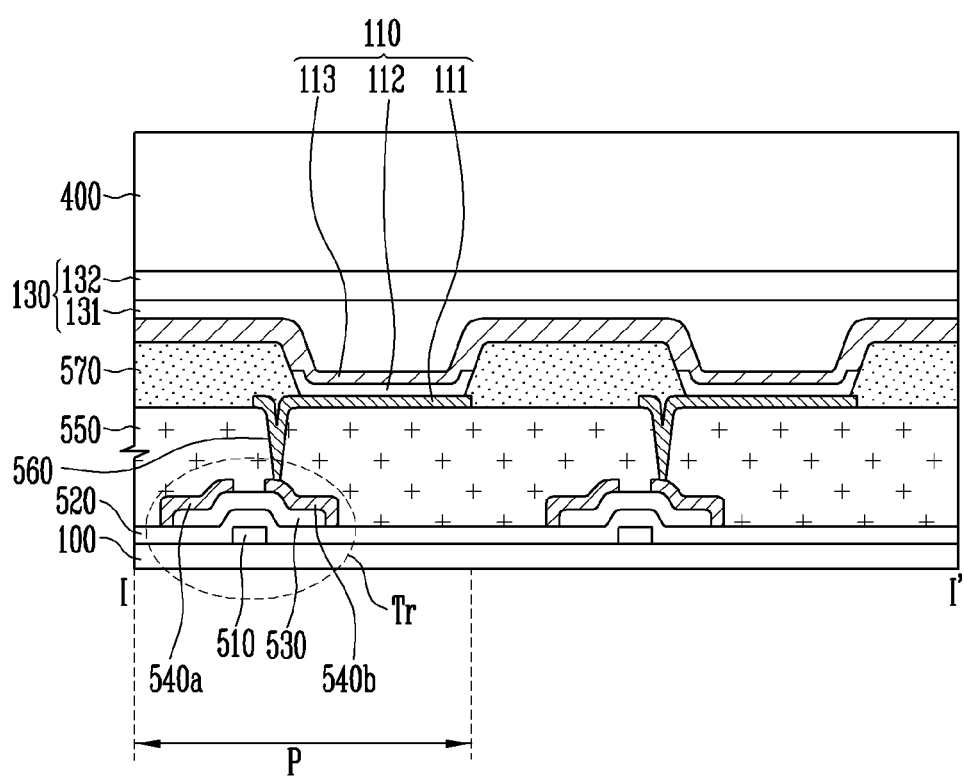
FIG. 5 is a cross-sectional view of area I-I' of FIG. 4.

FIG. 4 is a view illustrating a first substrate and configuration elements thereof according to an embodiment of the present disclosure, and FIG. 5 is a sectional view of area I-I' of FIG. 5.

Referring to FIG. 4, a first substrate 100 may include a first area A1 and a second area A2.

Light emitting elements 100 may be arranged in the first area A1, and indicated as a display area that displays an image.

The remaining area arranged at the outside of the first area A1 of the first substrate 100 may be indicated as a non-display area, and a second area A2 may be defined in a partial area of the non-display area.

The connecting pads 120 and the driving pads 150 may be arranged in the second area A2 and one side of the first area A1.

The thin film encapsulation layer 130 may be arranged on the first area A1 and seal the light emitting elements 110.

The interlayer 400 may be formed larger than the first area A1, and arranged on the thin film encapsulation layer 130 and the partial area of the first substrate 100 adjacent to the thin film encapsulation layer 130 accordingly.

The connecting pads 120 may be arranged in the second area A2 and include first connecting pads 121 and second connecting pads 122.

The first connecting pads 121 and the second connecting pads 122 may be electrically connected to the sensing pads 220 arranged on the second substrate 200 through the conductive member 410.

The first connecting pads 121 and the second connecting pads 122 may be configured to be a plurality of rows.

The driving pads 150 may be arranged in the second area A2 and at the outside of the first and second connecting pads 121 and 122 for bonding with the flexible printed circuit board 170.

However, a position of the driving pads 150 may be variously changed within the area available for connecting the flexible printed circuit board 170.

Further, the driving pads 150 may be configured to be a plurality of rows.

The driving lines 160 may be arranged in the second area A2 and connect the first and second pads 121 and 122 with the driving pads 150.

The first and second connecting pads 121 and 122 may be arranged on one side and the other side on the basis of the driving pads 150, respectively.

For example, referring to FIG. 4, the first connecting pads 121 may be arranged on a right side of the driving pads 150 and the second connecting pads 122 may be arranged on a left side of the driving pads 150.

The first and second connecting pads 121 and 122, the driving pads 150, and the driving lines 160 may be formed of the same material and with the same process.

Referring to FIG. 5, the light emitting element 110 may include a first electrode 111, a light emitting layer 112 and a second electrode 113.

The light emitting layer 112 may be arranged between the first electrode 111 and the second electrode 113. Further, the first electrode 111 and the second electrode 113 may function as an anode electrode and a cathode electrode, respectively.

For example, it is desirable that the light emitting layer 112 may include an organic emission layer for self-light emitting.

The light emitting layer 112 may be formed of a structure in which a hole transporting layer, an organic light emitting layer, and an electron transporting layer are stacked over, and further include a hole injection layer and an electron injection layer.

Based on the structure described above, an exciton may be generated by combining a hole injected from the first electrode 111 with an electron injected from the second electrode 113, and light of particular wavelength may be emitted by the light emitting layer 110 due to the energy from the generated exciton.

The plurality of pixels P may be arranged in the first area A1.

The pixel P may be configured to be a pixel circuit (not shown) including a driving transistor Tr and the light emitting element 110.

In FIG. 5, the driving transistor Tr directly related to the light emitting element 110 is illustrated for the convenience of explanation. The pixel circuit (not shown) may further include another transistor and a capacitor in addition to the driving transistor Tr to control emission of the light emitting element 110.

The driving transistor Tr may be formed on the first substrate 100 and installed corresponding to each light emitting element 110.

The driving transistor Tr may include a gate electrode 510, a gate insulating layer 520, a semiconductor layer 530, and source/drain electrodes 540*a* and 540*b*.

The gate electrode 510 may be formed on the first substrate 100.

The gate insulating layer 520 may be formed on the gate electrode 510. For example, the gate insulating layer 520 may be formed of an insulating material, for example, a silicon oxide layer (SiOx) or a silicon nitride layer (SiNx).

The semiconductor layer 530 may be formed on the gate insulating layer 520. For example, the semiconductor layer 530 may be formed of poly silicon, which may be amorphous silicon crystalized by using laser.

In addition, the semiconductor layer 530 may be formed of the amorphous silicon and an oxide semiconductor.

The source/drain electrodes 540*a* and 540*b* may be arranged on both sides of the semiconductor layer 530.

A protecting layer 550 may be arranged on the driving transistor Tr and include a contact hole 560 that exposes the source electrode 540*a* and the drain electrode 540*b*. In FIG. 5, the drain electrode 540*b* exposed by the contact hole 560 is illustrated as an example.

The gate electrode 510 and the source/drain electrodes 540*a* and 540*b* may be formed of metal, for example, molybdenum (Mo), tungsten (W), titanium (Ti), aluminum (Al), and an alloy of the metal, or a laminated structure thereof, but are not limited thereto.

A first electrode 111 may be formed in an upper portion of the protecting layer 550, and the first electrode 111 may be connected to the source electrode 540*a* or the drain electrode 540*b* through the contact hole 560. In FIG. 5, the first electrode 111 connected to the drain electrode 540*b* through the contact hole 560 is illustrated as an example.

For example, the protecting layer 550 may be formed of an insulating material such as a silicon oxide layer or a silicon nitride layer.

A pixel definition layer 570 may be arranged on the protecting layer 550. In addition, the pixel definition layer 570 may expose at least a partial area of the first electrode 111.

For example, the pixel definition layer 570 may be formed of organic insulating material, for example, acryl-based organic compound, polyamide, polyimide, but is not limited thereto, and may be formed of various types of insulating material.

The thin film encapsulation layer 130 may be formed on the light emitting elements 110. In more detail, the thin film encapsulation layer 130 may be arranged on the second electrode 113.

In addition, the thin film encapsulation layer 130 may be formed of the structure on which the plurality of layers are stacked. For example, the thin film encapsulation layer 130 may include at least one organic layer 131 and at least one inorganic layer 132.

In FIG. 5, the thin film encapsulation layer 130 including one organic layer 131 and one inorganic layer 132 is illustrated. However, the thin film encapsulation layer 130 may include a plurality of organic layers 131 and a plurality of inorganic layers 132, and the plurality of organic layers 131 and the plurality of inorganic layers 132 may be alternately stacked.

The interlayer 400 may be formed on the thin film encapsulation layer 130.

Figure 6:
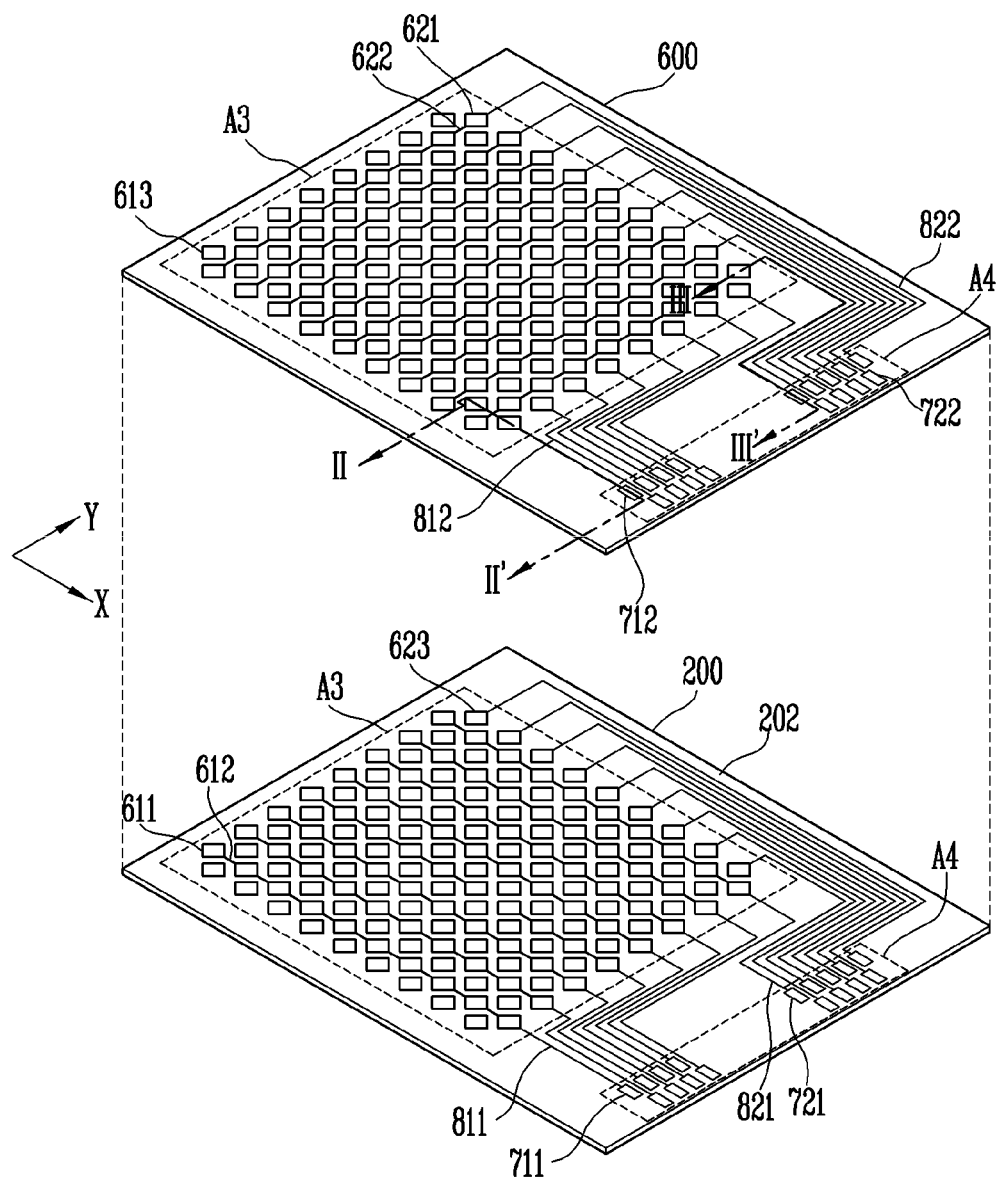
FIG. 6 is a schematic view illustrating a second substrate and configuration elements thereof according to an embodiment of the present disclosure.
Figure 7:
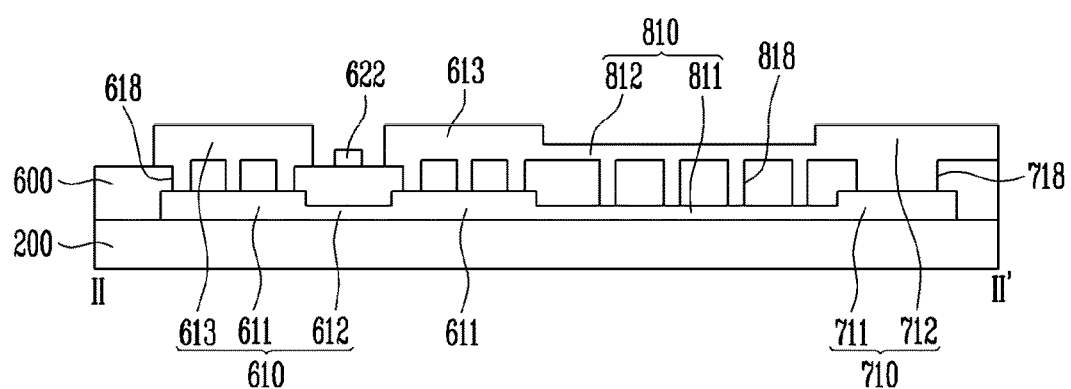
FIG. 7 is a cross-sectional view of area II-IP of FIG. 6.
Figure 8:
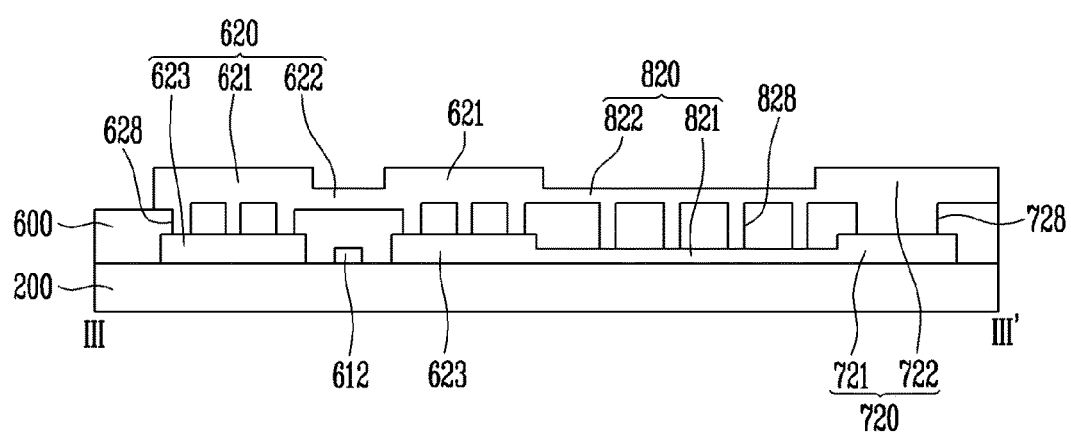
FIG. 8 is a cross-sectional view of area of FIG. 6.

FIG. 6 is a schematic view illustrating a second substrate and configuration elements thereof according to an embodiment of the present disclosure. FIG. 7 is a cross-sectional view of area II-IP of FIG. 6. FIG. 8 is a cross-sectional view of area of FIG. 6.

Particularly, for the convenience of explanation, the second substrate 200 is reversed in FIGS. 6 to 8 compared to FIG. 1.

Referring to FIG. 6, the second substrate 200 may include a third area A3 and a fourth area A4.

The third area A3 is an area where the sensing electrodes 610 and 620 are arranged and indicated as a touch active area that recognizes a touch of the user.

In addition, the third area A3 may correspond to the first area A1 of the first substrate 100, and the first area A1 and the third area A3 may overlap each other.

The remaining area arranged at the outside of the third area A3 of the first substrate 100 may be indicated a non-active touch area, and the fourth area A4 may be defined in a partial area of the non-active touch area.

The sensing pads 220 described in FIG. 1 may be arranged in the fourth area A4 and arranged on one side of the third area A3.

Referring to FIGS. 7 and 8, the sensing pads 220 may include first sensing pads 710 and second sensing pads 720.

The first sensing pads 710 and the second sensing pads 720 may be formed at positions corresponding to the first connecting pads 121 and the second connecting pads 122, respectively.

Accordingly, the first sensing pads 710 and the second sensing pads 720 may be electrically connected to the first connecting pads 121 and the second connecting pads 122, respectively, through the conductive member 410.

In addition, each of the first and second sensing pads 710 and 720 may include two layers of conductive patterns stacked respectively.

For example, the first sensing pads 710 may include first conductive patterns 711 and second conductive patterns 712 contacting each other, and the second sensing pads 720 may include the first conductive patterns 721 and the second conductive patterns 722 contacting each other.

The insulating layer 600 may be arranged between the first conductive patterns 711 and 721 and the second conductive patterns 712 and 722. The conductive patterns 711 and 721 and the second conductive patterns 712 and 722 may be connected each other through the respective contact holes 718 and 728 formed in the insulating layer 600.

For example, the first conductive patterns 711 and 721 may be arranged on the second substrate 200, and the second conductive patterns 712 and 722 may be arranged on the insulating layer 600. In addition, the insulating layer 600 may include the contact holes 718 and 728 formed in the area where the first conductive patterns 711 and 721 overlap the second conductive patterns 712 and 722.

Meanwhile, the touch sensor layer 300 described in FIG. 1 may include sensing electrodes 610 and 620 and the sensing lines 810 and 820.

The sensing electrodes 610 and 620 may be arranged in the third area A3, and the sensing lines 810 and 820 may be connected between the sensing electrodes 610 and 620 and the sensing pads 710 and 720.

The sensing electrodes 610 and 620 may include the first sensing electrodes 610 and the second sensing electrodes 620, which are arranged in an intersection direction.

For example, the first sensing electrodes 610 may be formed to extend in a first direction (for example, in a direction of axis X), and a plurality of the first sensing electrodes 610 may be arranged in a second direction (for example, in a direction of axis Y) that intersects the first direction.

In addition, the second sensing electrodes 620 may be formed to extend in the second direction, and the plurality of the second sensing electrodes 620 may be arranged along the first direction.

The first sensing electrodes 610 and the second sensing electrodes 620 may be formed of transparent conductive material and other conductive materials such as an opaque metal.

For example, the first sensing electrodes 610 and the second sensing electrodes 620 may be formed of indium tin oxide (ITO), indium zinc oxide (IZO), graphene, carbon nanotube, silver nanowires (AgNWs).

The sensing electrodes 610 and 620 may include sensing cells 611 and 621, connecting patterns 612 and 622 that interconnect the sensing cells 611 and 621, and auxiliary cells 613 and 623 arranged on the layer different from the sensing cells 611 and 621 and electrically connected with the sensing cells 611 and 621.

For example, each of the first sensing electrodes 610 may include first sensing cells 611, first connecting patterns 612 and first auxiliary cells 613.

A plurality of first sensing cells 611 may be arranged along the first direction, and the first connecting patterns 612 may connect the first sensing cells 611 adjacent to each other.

The first auxiliary cells 613 may be arranged on the layer different from the first sensing cells 611 and electrically connected to the first sensing cells 611.

The insulating layer 600 may be arranged between the first sensing cells 611 and the first auxiliary cells 613, and the first sensing cells 611 and the first auxiliary cells 613 may be connected through the contact holes 618 formed in the insulating layer 600.

For example, the first sensing cells 611 and the first connecting patterns 612 may be arranged on the second substrate 200, and the first auxiliary cells 613 may be arranged on the insulating layer 600. In addition, the insulating layer 600 may include the contact holes 618 formed in the area where the first sensing cells 611 overlap the first auxiliary cells 613.

Each of the second sensing electrodes 620 may include second sensing cells 621, second connecting patterns 622 and second auxiliary cells 623.

A plurality of second sensing cells 621 may be arranged along the second direction, and the second connecting patterns 622 may connect the second sensing cells 621 adjacent to each other.

The second auxiliary cells 623 may be arranged on the layer different from the second sensing cells 621, and electrically connected to the second sensing cells 621.

The insulating layer 600 may be arranged between the second sensing cells 621 and the second auxiliary cells 623, and the second sensing cells 621 and the second auxiliary cells 623 may be connected through the contact holes 628 formed in the insulating layer 600.

For example, the second sensing cells 621 and the second connecting patterns 622 may be arranged on the insulating layer 600, and the second auxiliary cells 623 may be arranged on the second substrate 200.

In addition, the insulating layer 600 may include the contact holes 628 formed in the area where the second sensing cells 621 and the second auxiliary cells 623 overlap.

Sensing lines 810 and 820 may include first sensing lines 810 and second sensing lines 820.

The first sensing lines 810 may be connected between first sensing electrodes 610 and first sensing pads 710.

The second sensing lines 820 may be connected between second sensing electrodes 620 and second sensing pads 720.

The sensing lines 810 and 820 may be arranged at the outside of the third area A3, and include first conductive lines 811 and 821 and second conductive lines 812 and 822 arranged on the layer different from the first conductive lines 811 and 821 and electrically connected with the first conductive lines 811 and 821.

For example, each of the first sensing lines 810 may include the first conductive line 811 and the second conductive line 812.

In addition, each of the second sensing lines 820 may include the first conductive line 821 and the second conductive line 822.

The insulating layer 600 may be arranged between the first conductive lines 811 and 821 and the second conductive lines 812 and 822, and the first conductive lines 811 and 821 and the second conductive lines 812 and 822 may be connected through the contact holes 818 and 828 formed in the insulating layer 600.

For example, the first conductive lines 811 and 821 may be arranged on the second substrate 200, and the second conductive lines 812 and 822 may be arranged on the insulating layer 600. In addition, the insulating layer 600 may include the contact holes 818 and 828 formed in the area where the first conductive lines 811 and 821 overlap the second conductive lines 812 and 822.

The first conductive lines 811 and 821 may be directly connected to the first conductive patterns 711 and 721, and the second conductive lines 812 and 822 may be directly connected to the second conductive patterns 712 and 722.

For example, referring to FIG. 7, the first conductive line 811 of the first sensing line 810 may directly connect the first sensing electrode 610 with the first conductive pattern 711 of the first sensing pad 710, and the second conductive line 812 of the first sensing line 810 may directly connect the first sensing electrode 610 with the second conductive pattern 712 of the first sensing pad 710.

In addition, referring to FIG. 8, the first conductive line 821 of the second sensing line 820 may directly connect the second sensing electrode 620 and the first conductive pattern 721 of the second sensing pad 720, and the second conductive line 822 of the second sensing line 820 may directly connect the second sensing electrode 620 and the second conductive pattern 722 of the second sensing pad 720.

As described above, the sensing electrodes 610 and 620, the sensing pads 710 and 720, and the sensing lines 810 and 820 may include a double layer structure and improve touch sensitivity by reducing resistance.

Figure 9:
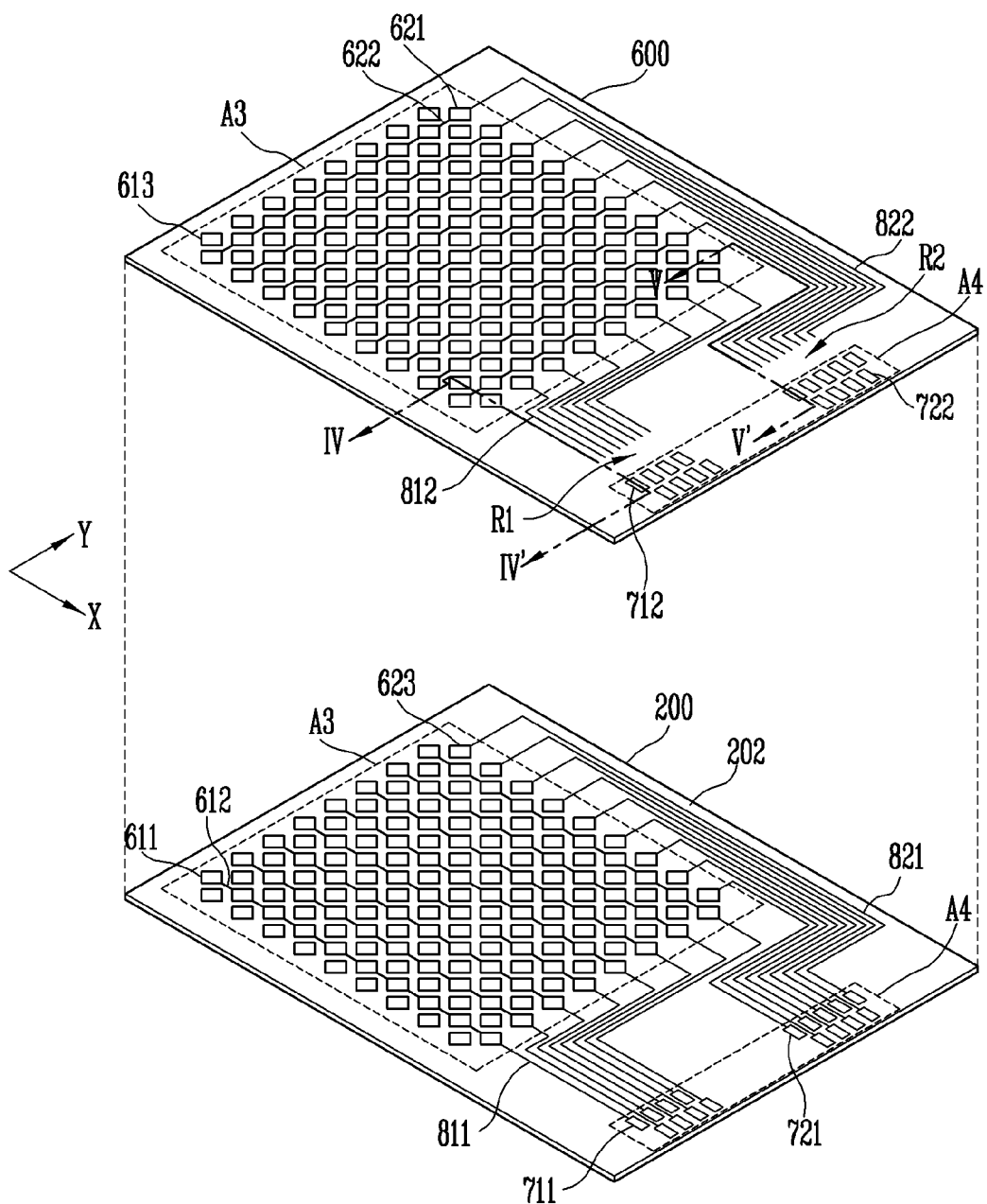
FIG. 9 is a schematic view illustrating a second substrate and configuration elements thereof according to an embodiment of the present disclosure.
Figure 10:
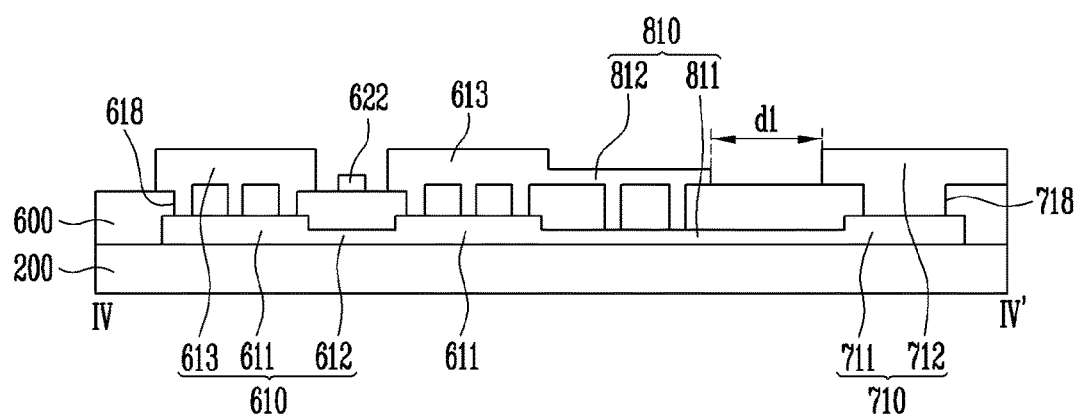
FIG. 10 is a cross-sectional view of area IV-IV' of FIG. 9.
Figure 11:
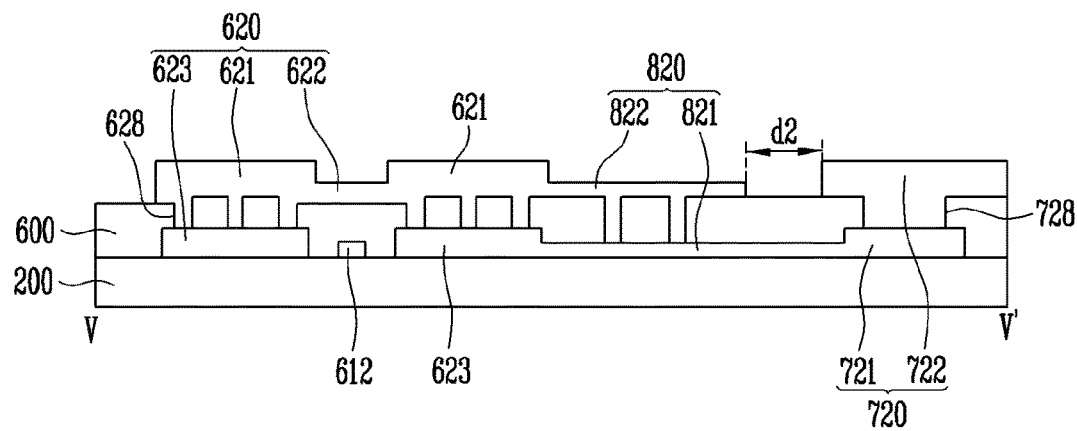
FIG. 11 is a cross-sectional view of area V-V' of FIG. 9.

FIG. 9 is a schematic view illustrating a second substrate and configuration elements thereof according to an embodiment of the present disclosure, and FIG. 10 is a cross-sectional view of area IV-IV' of FIG. 9. FIG. 11 is a cross-sectional view of area V-V' of FIG. 9.

The difference from an embodiment of FIGS. 6 to 8 is described, and the duplication thereof is omitted.

The first sensing pads 710 and the second sensing pads 720 may be electrically connected to the first connecting pads 121 and the second connecting pads 122 through the conductive member 410, respectively.

The conductive member 410 may be arranged on the second conductive patterns 712 of the first sensing pads 710 and the second conductive patterns 722 of the second sensing pads 720.

However, the conductive member 410 may be spread on the area where the second conductive patterns 712 and 722 are arranged and the neighbor area where the second conductive lines 812 and 822 are arranged by a process margin of an applying process and a bonding process of the substrates 100 and 200.

In an embodiment in connection with FIGS. 6 to 8, a short between the second conductive lines 812 and 822 by the conductive member 410, or a short between the second conductive lines 812 and 822 and the second conductive patterns 712 and 722 may be generated.

Accordingly, in an embodiment related to FIGS. 9 to 11, unexpected short by the conductive member 410 is prevented by removing the second conductive lines 812 and 822 arranged in the areas R1 and R2 neighboring the second conductive patterns 712 and 722.

For example, the second conductive lines 812 of the first sensing lines 810 may be spaced apart from the second conductive patterns 712 of the first sensing pads 710 by a predetermined distance d1, and the second conductive lines 822 of the second sensing lines 820 may be spaced apart from the second conductive patterns 722 of the second sensing pads 720 by a predetermined distance d2.

The distances d1 and d2 of the second conductive patterns 712 and 722 and the second conductive lines 812 and 822 may be determined by considering the process margin of the conductive member 410, for example, the distances d1 and d2 may be set to 10 um to 1000 um.

In addition, the distances d1 and d2 of the second conductive patterns 712 and 722 and the second conductive lines 812 and 822 may be set to around 400 um, for example, the distance may be set to 350 um to 450 um.

Figure 12A:
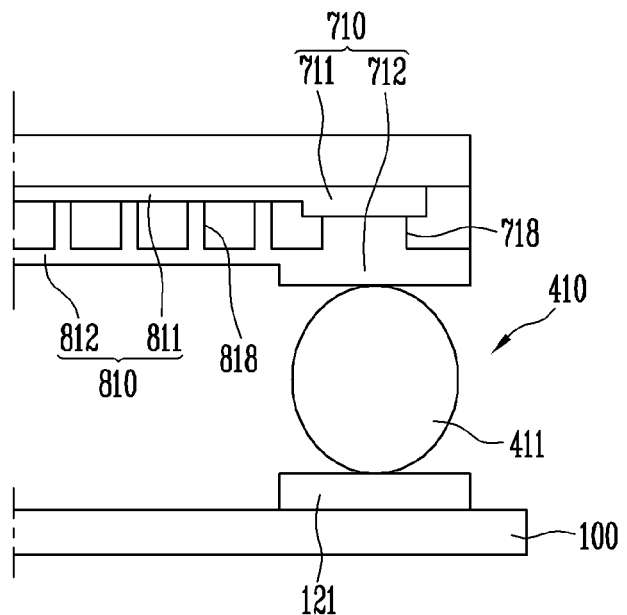
FIGS. 12A and 12B are views illustrating a conductive member according to an embodiment of the present disclosure.
Figure 12B:
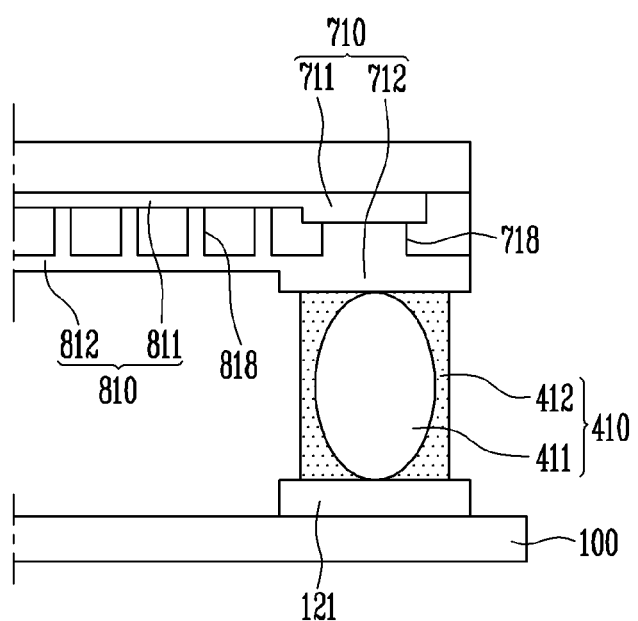

FIGS. 12A and 12B are views illustrating the conductive member according to an embodiment of the present disclosure.

Referring to FIG. 12A, the conductive member 410 may include a conductive ball 411. The conductive ball 411 may be arranged between the first sensing pad 710 and the first connecting pad 121 and electrically connect the first sensing pad 710 and the first connecting pad 121.

For example, the conductive ball 411 may contact the second conductive pattern 712 of the first sensing pad 710 and the first connecting pad 121.

Referring to FIG. 12B, the conductive member 410 may include the conductive ball 411 and a resin 412. The resin 412 may include a plurality of conductive balls 411, be applied between the first sensing pad 710 and the first connecting pad 121, and electrically connect the first sensing pad 710 and the first connecting pad 121.

For example, the conductive ball 411 included in the resin 412 may contact the second conductive pattern 712 of the first sensing pad 710 and the first connecting pad 121.

The second sensing pad 720 and the second connecting pad 122 may be connected in the same way in which the first sensing pad 710 is connected to the first connecting pad 121.

Figure 13:
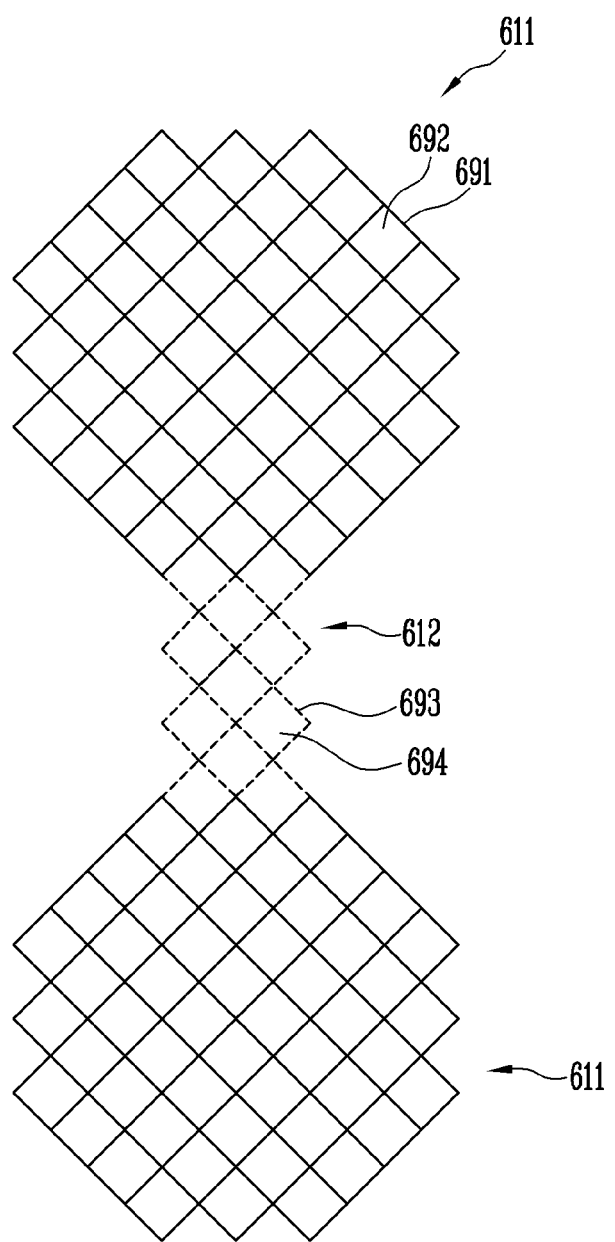
FIG. 13 is a view illustrating a sensing cell according to an embodiment of the present disclosure.

FIG. 13 is a view illustrating sensing cells according to an embodiment of the present disclosure. Particularly, the first sensing cells 611 and the first connecting pattern 612 included in the first sensing electrode 610 are illustrated in FIG. 13. In addition, for the convenience of explanation, the first sensing cells are illustrated in a solid line, and the first connecting pattern 612 is illustrated in a broken line.

As described above, the first sensing cells 611 may be arranged along a predetermined direction, and the first connecting pattern 612 may connect the first sensing cells 611 adjacent to each other.

Each of the first sensing cells 611 may comprise the mesh shape including the plurality of openings 692.

The first sensing cells 611 may be configured to be thin metal lines 691 and form the plurality of openings 692.

In addition, although not illustrated, the first auxiliary cells 613 electrically connected to the first sensing cells 611 may include the same mesh shape as the first sensing cells 611.

The first connecting pattern 612 may comprise the same mesh shape including the plurality of openings 694 as the first sensing cell 611.

The first connecting pattern 612 may be configured to be thin metal lines 693 and form the plurality of openings 694.

Although the first sensing electrode 610 is illustrated, the second sensing electrode 620 may have the same shape as the first sensing electrode 610.

In other words, the second sensing cells 621, the second connecting patterns 622, and the second auxiliary cells 623 included in the second sensing electrode 620 may include the shape same as the first sensing cells 611, the first connecting patterns 612 and the first auxiliary cells 613.

FIGS. 14A to 14F illustrate a manufacturing method of a display device according to an embodiment of the present disclosure.

Figure 14A:
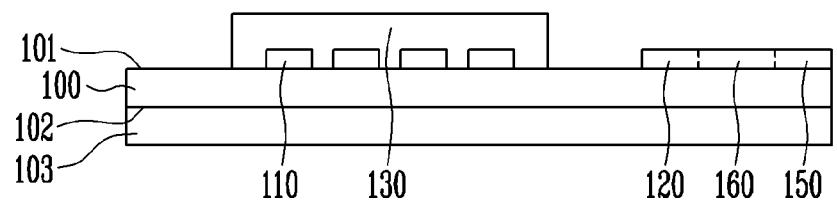
FIGS. 14A, 14B, 14C, 14D, 14E and 14F are views illustrating a manufacturing method of a display device according to an embodiment of the present disclosure

Referring to FIG. 14A, the first substrate on which the light emitting elements 110, the thin film capsulation layer 130 and the connecting pads 120 are formed is prepared.

When the first substrate 100 is flexible, the rigid third substrate 103 may be arranged on the lower portion of the first substrate 100 (for example, the second side (102)) and perform as the carrier substrate.

In another embodiment, use of the third substrate 103 may be omitted.

Since the configuration elements related to the first substrate 100 are illustrated in FIGS. 4 and 5, the description thereof is omitted.

Figure 14B:
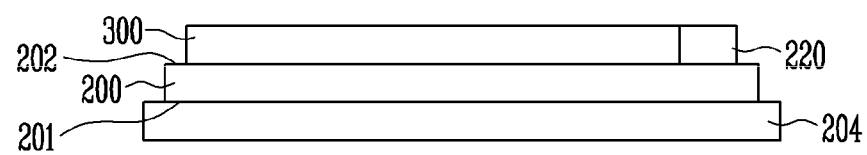

Referring to FIG. 14B, the second substrate on which the touch sensor layer 300 and the sensing pads 220 are formed is prepared.

As described in FIGS. 6 to 8, the touch sensor layer 300 may include the sensing electrodes 610 and 620 and the sensing lines 810 and 820, and the sensing lines 810 and 820 may be connected between the sensing electrodes 610 and 620 and sensing pads 220.

When the second substrate 200 is flexible, the rigid fourth substrate 204 may be arranged on the lower portion of the second substrate 200 (for example, the first side (201)) and perform as the carrier substrate.

While preparing the second substrate, the second substrate 200 may be arranged such that the second side 202 faces the upper portion to form the touch sensor layer 300 and the sensing pads 220.

Preparing the first substrate and preparing the second substrate may be performed simultaneously or sequentially according to a particular order.

In another embodiment, the use of the fourth substrate 204 may be omitted.

Since the configuration elements related to the second substrate 200 are illustrated in FIGS. 6 and 8, the description thereof is omitted.

Figure 14C:
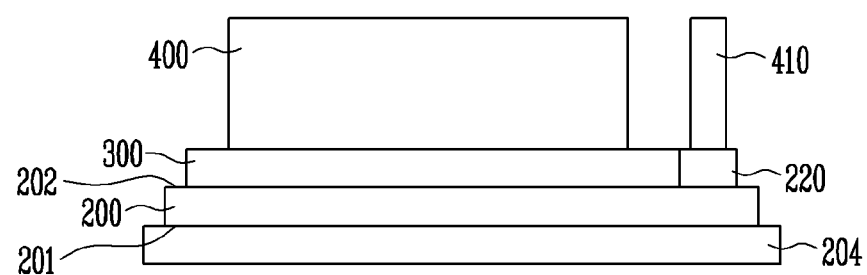

Referring to FIG. 14C, applying the interlayer 400 and applying the conductive member 410 may be performed.

The interlayer 400 may be formed on the touch sensor layer 300 of the second substrate 200 as described in FIG. 14C.

Alternatively, the interlayer 400 may be formed on the thin film capsulation layer 130 of the first substrate 100.

For example, the interlayer 400 may be formed by at least one of a printing method, such as a screen printing, an inkjet printing and a nozzle printing, a coating method, such as a slit coating, a spin coating and a spray coating, and a dispensing method using a dispenser.

Accordingly, since the interlayer 400 may be formed without using photolithography through the conventional mask, the number of masks used in the manufacturing process may be reduced, and the manufacturing process becomes simplified.

In addition, the conductive member 410 may be formed on the sensing pads 220 of the second substrate 200 as described in FIG. 14C.

Generally, the conductive member 410 may be formed on the connecting pads 120 of the first substrate 100.

For example, the conductive member 410 may be formed by the dispensing method using the dispenser.

The dispenser may include a predetermined applying margin, and a short may be generated between the sensing lines 810 and 820. Accordingly, the configuration to protect generating the short is illustrated in FIGS. 9 to 11.

Applying the interlayer 400 and applying the conductive member 410 may be performed at the same time or sequentially in a particular order.

Figure 14D:
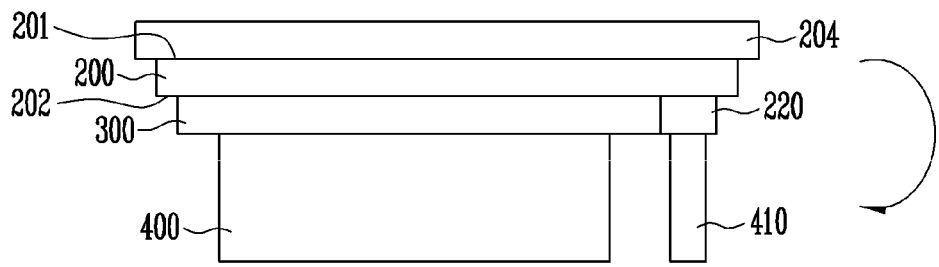

Referring to FIG. 14D, reversing the second substrate 200 may be performed.

To bond the second substrate 200 to the first substrate 100, the second substrate 200 may be reversed such that the touch sensor layer 300 of the second substrate 200 faces the first substrate 100.

Accordingly, the touch sensor layer 300 of the second substrate 200 may be opposite to the thin film encapsulation 130 of the first substrate 100.

Unlike preparing the second substrate as described above, the second substrate 200 may be arranged such that the second side 202 faces a lower portion.

Figure 14E:
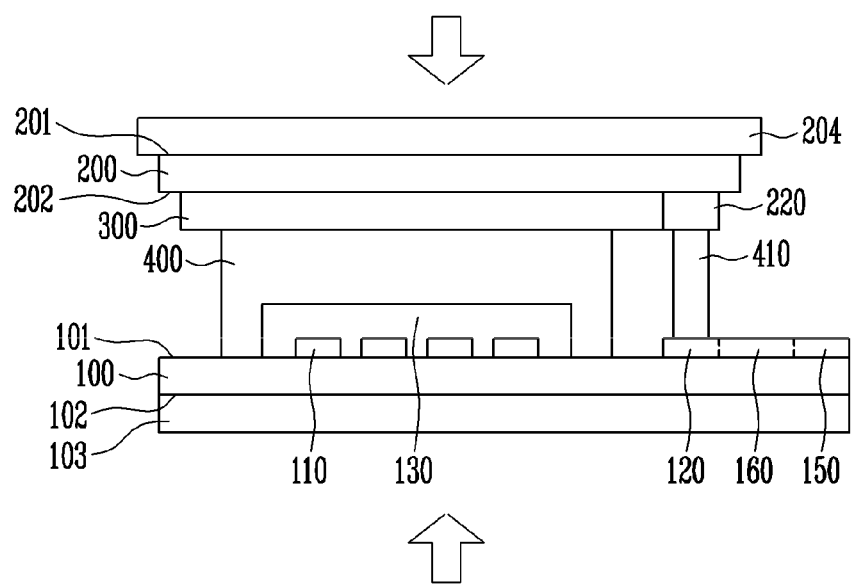

Referring to FIG. 14E, bonding the first substrate 100 to the second substrate 200 may be performed.

The first substrate 100 and the second substrate 200 may be bonded by the interlayer 400 having adhesiveness.

For example, one side of the interlayer 400 may be contacted to the thin film encapsulation layer 130 and the portion of the first substrate 100 adjacent to the thin film encapsulation layer 130, and other side of the interlayer 400 may be contacted to the touch sensor layer 300.

The contacting pads 120 and the sensing pads 220 may be electrically interconnected through the conductive member 410 by bonding the substrates 100 and 200.

Figure 14F:
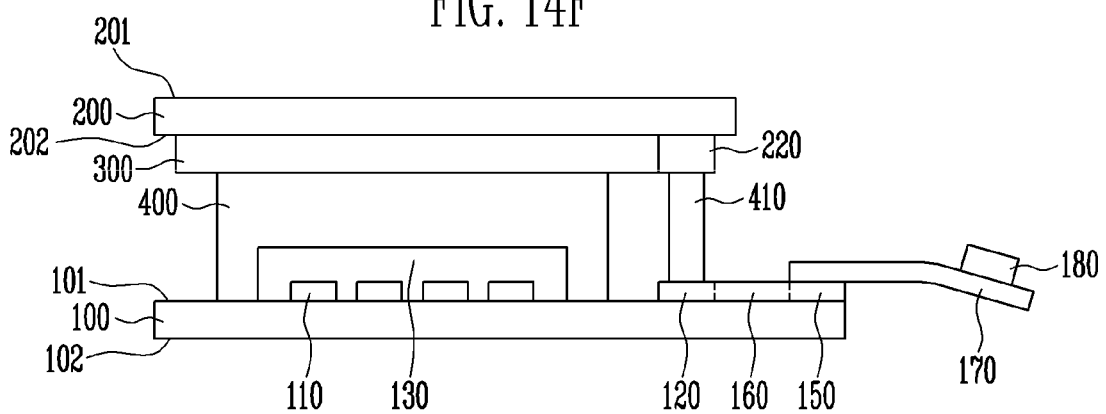

Referring to FIG. 14F, removing the third substrate 103 and the fourth substrate 204 may be performed.

When the third substrate 103 and the fourth substrate 204 are used as carrier substrates in preparing the first substrate and the second substrate, the third substrate 103 and the fourth substrate 204 may be erased to embody a flexible display device.

In preparing the first substrate and the second substrate, the erasing step may be omitted if the third substrate 103 and the fourth substrate 204 are not used, or the flexible display device is not necessarily embodied.

Bonding the flexible printed circuit board 170 to the driving pads 150 may be performed.

According to an embodiment of the present disclosure as described above, the display device including the touch panel and a manufacturing method thereof may be provided.

In addition, according to the present disclosure, the display device with a simplified manufacturing process and a manufacturing method thereof are provided.

Embodiments are provided herein to help convey the spirit and scope of the present invention to those skilled in the art to which the invention pertains. The scope of the invention should be understood by the claims of the invention. Accordingly, those of ordinary skill in the art would appreciate that various changes in form and details may be made without departing from the spirit and scope of the invention as set forth in the following claims. Therefore, the technical range of the present invention is not limited to the detailed description of the specification but defined by the range of the claims.

What is claimed is:

1. A display device, comprising:
a first substrate including a first area and a second area;
light emitting elements arranged in the first area;
connecting pads arranged in the second area;
a thin film encapsulation layer arranged on the light emitting elements;
a second substrate including a third area and a fourth area;

sensing pads arranged in the fourth area;
a touch sensor layer including sensing electrodes arranged in the third area and sensing lines connected between the sensing electrodes and the sensing pads;
an interlayer arranged between the thin film encapsulation layer and the touch sensor layer, and covering an edge of the thin film encapsulation layer; and
a conductive member connected between the connecting pads and the sensing pads.

2. The display device of claim 1, wherein the sensing electrodes include sensing cells, connecting patterns interconnecting the sensing cells, and auxiliary cells arranged on a layer different from that of the sensing cells and electrically connected to the sensing cells.

3. The display device of claim 2, wherein the sensing lines include first conductive lines and second conductive lines arranged on a layer different from that of the first conductive lines and electrically connected to the first conductive lines.

4. The display device of claim 3, wherein the touch sensor layer further includes an insulating layer, and
the insulating layer is arranged between the sensing cells and the auxiliary cells and between the first conductive lines and the second conductive lines.

5. The display device of claim 4, wherein the sensing pads include first conductive patterns and second conductive patterns contacting the first conductive patterns.

6. The display device of claim 5, wherein the first conductive lines are directly connected to the first conductive patterns.

7. The display device of claim 6, wherein the second conductive lines are directly connected to the second conductive patterns.

8. The display device of claim 6, wherein the second conductive lines are spaced apart from the second conductive patterns by a predetermined distance and electrically connected to the first conductive patterns through the first conductive lines.

9. The display device of claim 8, wherein a distance between the second conductive lines and the second conductive patterns is set to 10 um to 1000 um.

10. The display device of claim 2, wherein the sensing cells and the auxiliary cells include a mesh shape having a plurality of openings.

11. The display device of claim 10, wherein the connecting patterns include the mesh shape having the plurality of openings.

12. The display device of claim 1, wherein the thin film encapsulation layer includes at least one organic layer and at least one inorganic layer.

13. The display device of claim 1, wherein the interlayer has adhesiveness.

14. The display device of claim 13, wherein the interlayer overlaps the sensing electrodes and the sensing lines.

15. The display device of claim 13, wherein a thickness of the interlayer is set to 5 um to 30 um.

16. The display device of claim 1, wherein the first substrate and the second substrate are flexible.

17. The display device of claim 16, further comprising:
a third substrate bonded to the first substrate; and
a fourth substrate bonded to the second substrate.

18. The display device of claim 17, wherein the third substrate and the fourth substrate are rigid.

19. The display device of claim 1, wherein the third area overlaps the first area.

20. The display device of claim 1, further comprising a polarizing plate arranged above or below the touch sensor layer.

21. The display device of claim 1, wherein the conductive member includes a conductive ball.

* * * * *